United States Patent
Wallen

(10) Patent No.: US 6,634,240 B1
(45) Date of Patent: Oct. 21, 2003

(54) ZERO CROSSING DETECTOR AND METHOD OF DETERMINING A ZERO CROSSING POINT

(75) Inventor: Lars Wallen, Spanga (SE)

(73) Assignee: Siemens-Elema AB, Solna (SE)

( * ) Notice: Subject to any disclaimer, the term of this patent is extended or adjusted under 35 U.S.C. 154(b) by 0 days.

(21) Appl. No.: 09/377,133

(22) Filed: Aug. 19, 1999

(30) Foreign Application Priority Data

Aug. 19, 1998 (SE) .............................................. 9802762

(51) Int. Cl.⁷ .............................................. G01F 1/66
(52) U.S. Cl. .............................. 73/861.28; 73/861.27; 73/861.29
(58) Field of Search ........................... 73/861.28, 861.6, 73/861.29, 861.31

(56) References Cited

U.S. PATENT DOCUMENTS

| | | | | |
|---|---|---|---|---|
| 3,738,169 A | * | 6/1973 | Courty ..................... | 73/861.03 |
| 4,022,058 A | * | 5/1977 | Brown ........................ | 73/597 |
| 4,080,574 A | * | 3/1978 | Loosemore et al. .......... | 327/19 |
| 4,515,021 A | * | 5/1985 | Wallace et al. ............... | 73/597 |
| 4,527,433 A | * | 7/1985 | Gutterman ............... | 73/861.28 |
| 4,538,469 A | * | 9/1985 | Lynnworth et al. ........... | 73/597 |
| 5,123,286 A | * | 6/1992 | Baumgartner ............ | 73/861.27 |
| 5,247,826 A | | 9/1993 | Frola et al. | |
| 5,553,505 A | * | 9/1996 | Bignell et al. ........... | 73/861.27 |
| 5,639,971 A | | 6/1997 | Brown | |
| 5,814,737 A | * | 9/1998 | Brown ..................... | 73/861.27 |

FOREIGN PATENT DOCUMENTS

| | | |
|---|---|---|
| EP | 0 185 133 | 6/1986 |
| WO | WO 94/28790 | 12/1994 |

\* cited by examiner

*Primary Examiner*—Edward Lefkowitz
*Assistant Examiner*—Lilybett Martir
(74) *Attorney, Agent, or Firm*—Schiff Hardin & Waite

(57) ABSTRACT

A zero crossing detector has an analyzer which determines a zero level crossing of a currently input electrical pulse packet and which emits a trigger signal indicative of a determination having been made, and a pre-trigger unit which monitors variations in the amplitude of the current input pulse packet to detect a crossing of a pre-trigger level. The detector further includes a control unit operably connected to the pre-trigger unit which compares the amplitude of the pre-trigger level with any amplitude of a signal derived from the current or a previous input electrical pulse packet, and which automatically controls the amplitude of the pre-trigger level to maintain a working difference therebetween.

7 Claims, 2 Drawing Sheets

ZERO CROSSING DETECTOR AND METHOD OF DETERMINING A ZERO CROSSING POINT

BACKGROUND OF THE INVENTION

1. Field of the Invention

The present invention relates to a zero crossing detector and to a method for detecting the zero crossing of a particular pulse in a packet of individual pulses particularly pulses obtained from an ultrasound source.

2. Description of the Prior Art

It is well established that a piezoelectric crystal does not emit a single pulse when energized with a single electrical pulse. Rather, the crystal is caused to oscillate at a characteristic resonant frequency to emit a "packet" that contains a number of different amplitude pulses. The envelope of the emitted packet decays rapidly with time in a generally consistent manner, usually producing a train of six or so cycles. An ultrasound detector which receives the emitted packet will emit an electrical pulse packet as an output that generally mirrors the composition of the detected ultrasound packet.

Flow meters are known in which the transit time of an ultrasonic pulse between an ultrasound generator and an ultrasound receiver is used to determine the velocity (and hence the flow rate) of the fluid through which the pulse was transmitted. Devices, such as those described in PCT Application WO 94/28790 and U.S Pat. No. 5,247,826, improve on this basic methodology by arranging for the transit times of ultrasonic pulses to be measured both upstream and downstream of the fluid flow. These transit times are then supplied to a microprocessor which is set to calculate the fluid flow rate using standard algorithms. As mentioned above, however, the received ultrasonic signal, typically transformed into a proportional electrical signal by the ultrasound receiver, will not contain a single pulse but rather a packet of six or so pulses. Thus small errors in the determination of the flow rate may result if the determination is made using different pulses from within the packet.

It also is well known in the art to include a zero crossing detector in such a flow meter in order to detect the arrival of a pulse. This detector includes an analyzer that operates by looking for a "zero" point crossing in which the amplitude of the detected ultrasonic signal, transformed to the proportional electrical signal, goes from "negative" to "positive" (or vice versa), crossing the zero point. Of course, it will be appreciated by those skilled in the art that the zero point need not be a true zero amplitude but rather a level approximately mid-range of an alternating amplitude signal.

When this zero point crossing is found the detector can then supply a trigger signal indicating that a crossing has been detected, which may be used to trigger stopping of a timer. In this way known flow meters generate a transit time of an ultrasonic pulse. Since there will usually be several zero crossing points in any pulse packet, a pre-trigger unit is often also provided within the detector which attempts to prevent any but the same pulse in each pulse packet from initiating the trigger signal. The unit operates in combination with the analyzer so that not until after the pulse packet signal has crossed a previously established threshold amplitude (a so called "pre-trigger level") will a zero level crossing initiate the output of a trigger signal. This pre-trigger level is usually factory preset or set during an initial calibration of the meter before use in order to establish a "working difference" between the threshold amplitude and the anticipated amplitudes of the electrical pulse packet. Because the pulses in the packet decay rapidly, all but the correct crossing can be discriminated against using this pre-trigger unit provided that the working difference is correctly set.

If the pre-trigger level is set too low it may be possible to register one of several crossing points of the electrical pulse packet as the necessary trigger and if set too high no crossing points may be registered. Establishing a working difference therefore involves arranging for the pre-trigger level to lie between these two extremes at an amplitude which will provide only a single zero-crossing point detection.

Unfortunately measurement errors may still occur even if the working difference was correctly set for one measurement since any changes in the absorption properties of the fluid through which the ultrasonic signal propagates, changes in the fluid flow rate, or changes in the operational characteristics of the ultrasonic generator or receiver with age, may cause the absolute amplitude of the proportional electrical signal pulse packet arriving at the pre-trigger unit to change to a level where it becomes possible to detect one of several crossing points or even no crossings at all.

Similarly, even when only a single pulse is generated within a pulse packet, and that pulse is to be detected and registered using a zero crossing detector, a pre-trigger level may still be used, for example to discriminate against noise or system fluctuations. Here again similar problems may occur if the working difference is incorrectly set.

SUMMARY OF THE INVENTION

It is an object of the present invention is to provide a zero crossing detector and a method for detecting a zero crossing within an input electrical pulse packet wherein at least some of the aforementioned problems associated with the setting of the working difference are mitigated.

The above object is achieved in accordance with the principles of the present invention in a zero crossing detector having an analyzer which determines a zero level crossing of a current input electrical pulse packet and which emits a trigger signal, as an output, indicative of this determination, a pre-trigger unit which monitors variations in the amplitude of the current input pulse packet to detect a crossing of a pre-trigger level, and a control unit connected to the pre-trigger unit which compares the amplitude of the pre-trigger level with the amplitude of a signal derived from the current input electrical pulse packet, or a previous input electrical pulse packet, and which automatically controls the amplitudes of the pre-trigger level provided to the pre-trigger unit, so as to maintain a working difference therebetween.

By arranging for the automatic control of the amplitude of the pre-trigger level in a manner to maintain a working difference therebetween, variations in the amplitude of the detected ultrasonic pulse packet which may have caused an improper zero-crossing point detection can be compensated for.

Preferably, the derived signal used by the control unit in the comparison with the pre-trigger level is obtained from the current input electrical pulse packet. This has the advantage that the detector is better able to respond to rapid changes in the amplitude between input signals.

A derived signal obtained from a previous input electric pulse packet may be advantageously used in some circumstances. This is particularly the case in circumstances where the use of the currently input electrical pulse packet would lead to unacceptable delays in the operation of the detector.

Preferably, the pre-trigger level is variable dependent on the maximum amplitude of the electrical pulse packet and is most preferably variable to maintain it at a constant fraction of that maximum amplitude. This makes use of the generally consistent amplitude relationship between pulses in a particular signal packet to more reliably establish a suitable pre-trigger level.

Such a detector as described above may be usefully incorporated into an ultrasonic flow meter of the type generally known in the art which operates by determining the time of flight of an ultrasound pulse between an ultrasound generator and receiver in a manner also generally known in the art.

DESCRIPTION OF THE PREFERRED EMBODIMENTS

Figure 1:
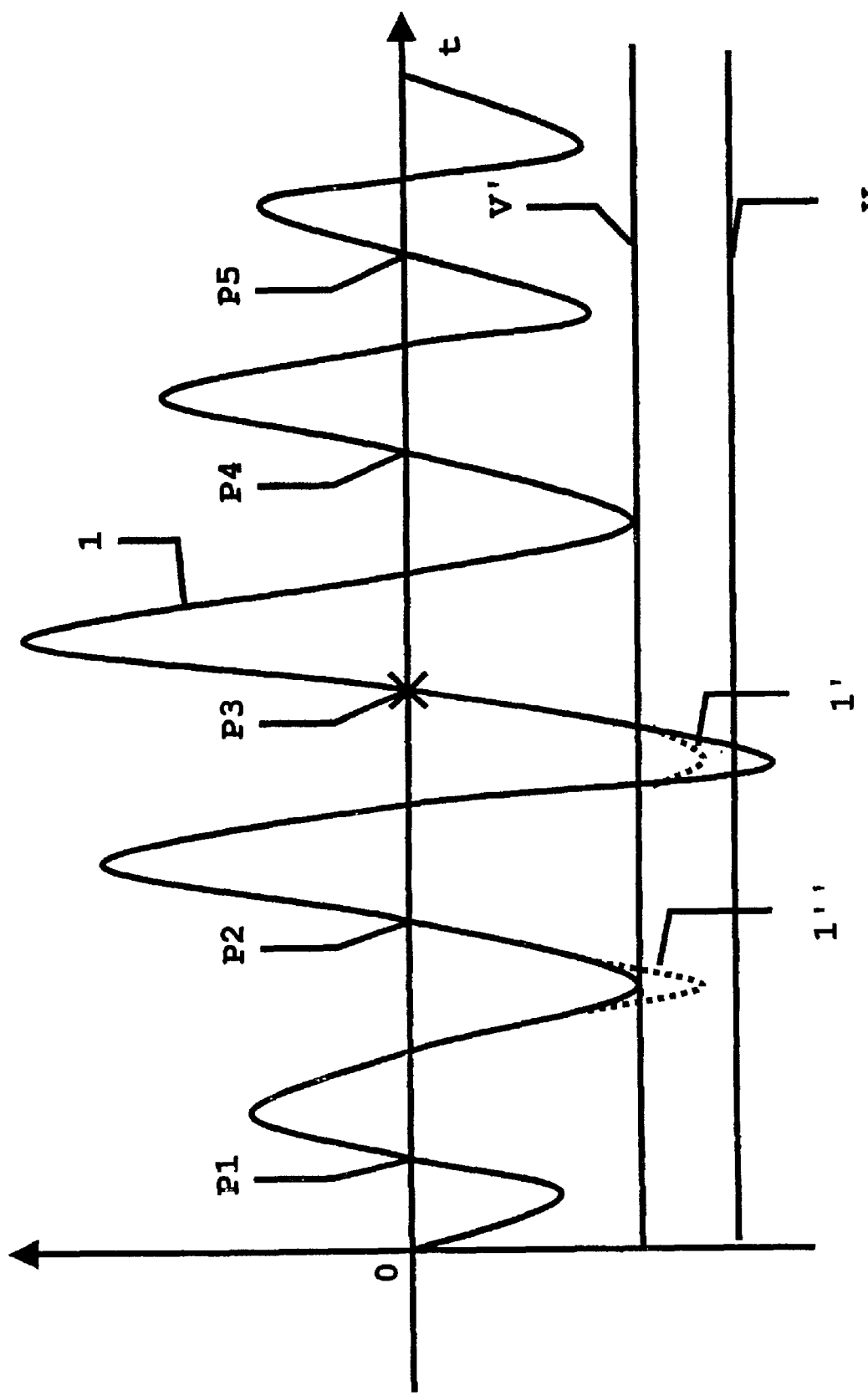
FIG. 1 shows a typical electrical signal representative of an ultrasound wave packet emitted by a piezoelectric crystal.

FIG. 1 illustrates a typical electrical signal 1 generated as a result of the detection of an ultrasonic wave packet originating from a piezoelectric transducer when stimulated with a single electrical pulse and is representative of the amplitude variations of the detected ultrasonic pulses in that packet with time t. As can be seen the electrical signal 1 contains a number of rapidly decaying pulses with amplitudes which alternate about a "zero" level. In this example, a zero crossing detector that is configured to operate to detect when the signal 1 crosses the zero level, moving from "negative" to "positive", could possibly detect any one of the five crossing points P1 ... P5. As is known in the art a preset pre-trigger level V may be employed so that, in theory, only the crossing P3 triggers a correct detection. FIG. 1 also illustrates what may happen in practice.

Assuming that the pre-trigger level V is set as shown, if the amplitude of the signal decreases as illustrated by the dotted line trace 1', for example because of a change in the properties of the medium through which the acoustic signal propagates, then the pre-trigger level will no longer be useable. Similarly if the pre-trigger level is set as shown by V' then a correct determination at P3 might still be expected in the above case, however, any increase in the signal, as illustrated by 1", for example because of noise, may trigger an incorrect detection at the crossing P2. This would lead to an error in the determination of the arrival of the ultrasonic pulse when using prior art flow meters that incorporate known zero crossing detectors.

Figure 2:
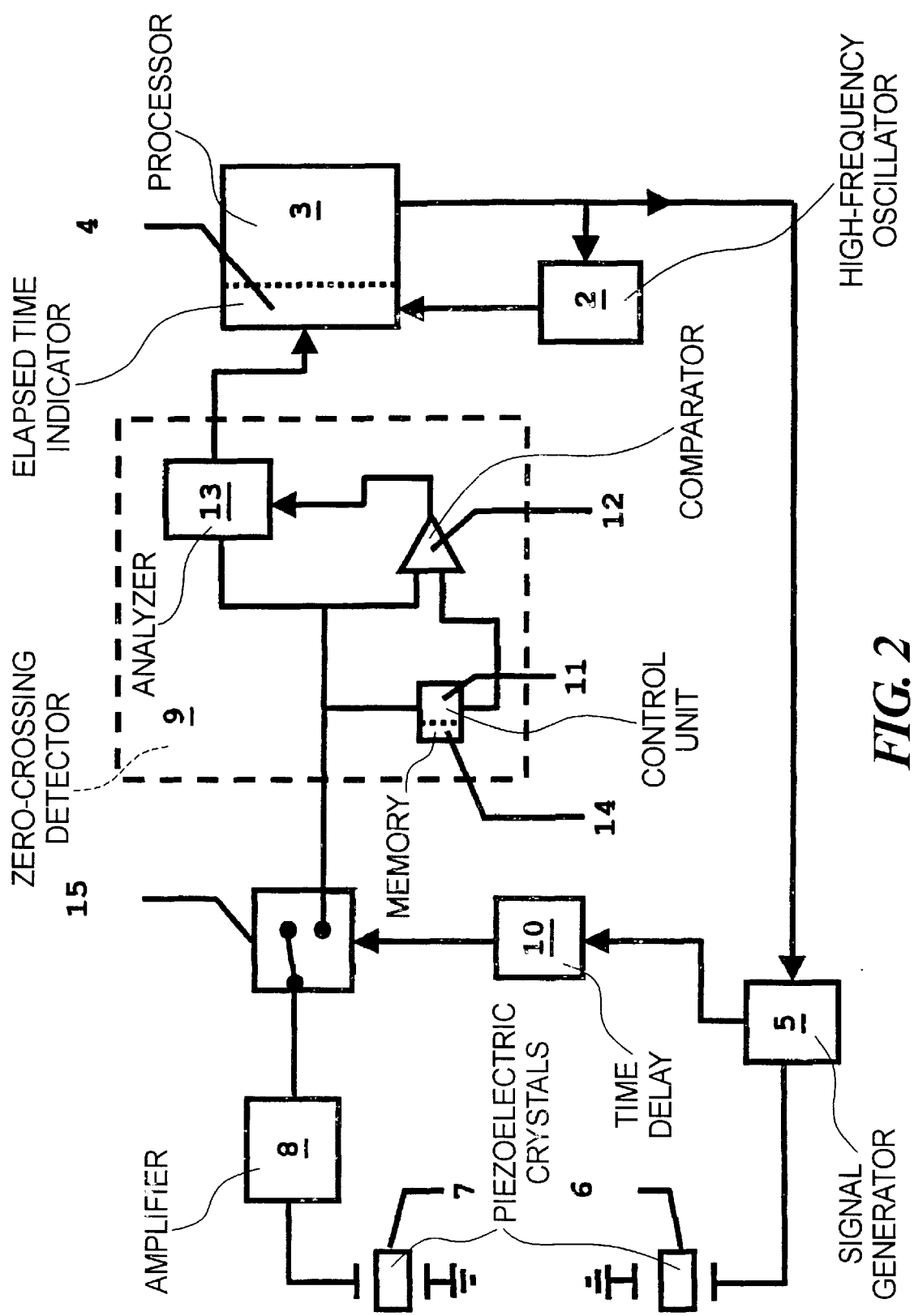
FIG. 2 shows a block diagram of the components of a flow meter according to the present invention.

A flow meter according to the present invention is shown schematically at FIG. 2. A high frequency oscillator 2 is connected to a processor 3 which is in part configured to act as an elapsed time indicator 4. The indicator 4 operates in the present example to count the number of pulses generated by the high frequency oscillator 2 in a time interval defined by input start and stop signals. From a knowledge of the count number and the oscillator frequency the elapsed time may be calculated in a manner known in the art.

Also connected to the processor 3 is an electrical signal generator 5 which provides electrical pulses to a piezoelectric crystal 6 for generating an ultrasound signal. A second piezoelectric crystal 7 is physically spaced from the crystal 6 and operates to convert incident ultrasound pulses into electrical signals. An amplifier 8 is connected between the crystal 7 and a zero crossing detector 9, the output of the detector 9 being connected to the elapsed time indicator 4 of the processor 3. A time delay 10 is also provided in operable connection between the signal generator 5 and the zero crossing detector 9.

The zero crossing detector 9 has a control means 11, a comparator 12, an analyzer 13 which operate as described below.

In use, the processor 3 produces a start command signal to the counter 4, the high frequency oscillator 2 and the electrical signal generator 5. On receipt of this start signal the indicator 4 is primed to receive and count pulses input from the oscillator 2, which Itself responds to the start signal by commencing the output of "clock" pulses at a known frequency to the indicator 4. The start signal from the processor 3 also triggers the production of an electrical pulse from the generator 5.

The electrical pulse from the generator 5 energizes the piezoelectric crystal 6 which then transmits a ultrasound pulse packet of the form generally shown in FIG. 1 through a medium whose flow is to be measured, for receipt by the receiving crystal 7. This crystal 7 then converts the ultrasound signal into an electrical pulse packet of the same relative amplitude as the ultrasonic pulse packet. The electrical pulse packet passes through the amplifier 8 to serve as a current input electrical pulse packet to the analyzer 13, the comparator 12 and the control unit 11.

The control unit 11 detects the maximum amplitude of the currently input electrical pulse packet and stores a representation of that maximum amplitude in a memory 14, this representation replacing an earlier-stored representation. The replaced earlier-stored representation of a maximum amplitude of a previous input electrical pulse packet is retrieved from the memory 14 of the control unit 11 before its replacement and is compared within the control unit 11 with a pre-trigger level. The control unit 11 is further configured to control the amplitude of the pre-trigger level dependent on this comparison in order to maintain a working difference between the two thus-compared amplitudes, for example by adjusting the pre-trigger level to remain a predetermined fraction of the earlier-stored maximum amplitude that was retrieved from the memory 14.

The controlled pre-trigger level is then supplied as an output from the control unit 11 to an input of the comparator 12. The comparator 12 operates to compare the amplitudes of the pre-trigger level and the current input electrical pulse packet to detect a crossing of the pre-trigger level by the pulse packet and to emit an output signal dependent on this detection. This output is used to control the operation of the analyzer 13 to prevent a trigger signal being emitted from the analyzer 13 until a crossing of the pre-trigger level is detected by the comparator 12. The analyzer 13 is configured to determine a zero-point crossing of the current input electrical pulse packet and to emit a trigger signal as an output when such a crossing is detected.

The trigger signal from analyzer 13 passes to the elapsed time indicator 4 of the processor 3 where it acts to stop counting by the indicator 4. The processor 3 is programmed to calculate the elapsed time using the count value from the indicator 4 and the known clock frequency of the high frequency oscillator 2 and from this to calculate the flow of the medium through which the ultrasound signal passed during transmission between the piezoelectric crystals 6 and 7 in a manner known in the art.

In the present example the time delay 10 is operably connected with the zero crossing detector 9 and the signal generator 5 and functions to reduce any adverse effects of electrical interference on the operation of the detector 9.

This may be achieved as shown in FIG. 2. The amplified electrical pulse packet is passed from the amplifier 8 into the detector 9 via a automatic switch 15. The switch 15 is operably connected to the time delay 10, which closes the switch 15 at a predetermined time after transmission of the electrical pulse by the generator 5 so that substantially only the electrical pulse packet generated by the received acoustic wave can be passed to the zero crossing detector 9. It will be appreciated that the time delay 10 may constructed in several ways and still achieve this function.

Although modifications and changes may be suggested by those skilled in the art, it is the intention of the inventor to embody within the patent warranted hereon all changes and modifications as reasonably and properly come within the scope of his contribution to the art.

I claim as my invention:

1. A zero crossing detector comprising:

an analyzer supplied with a current input electrical pulse packet exhibiting multiple zero level crossings, said analyzer detecting one and only one of said zero level crossings of said current input electrical pulse packet occurring anywhere in said electrical pulse packet and emitting a trigger signal indicative of said occurrence;

a pre-trigger unit, also supplied with said current input pulse packet, which monitors variations in an amplitude of said current input pulse packet to detect crossing of a pre-trigger level, having a variable amplitude, by said current input pulse packet, said pre-trigger unit being connected to said analyzer to inhibit emission of said trigger signal by said analyzer until said detection of said crossing of said pre-trigger level; and a control unit, connected to said pre-trigger unit, and supplied with an amplitude signal derived from one of said current input electrical pulse packet and at least one previous input electrical pulse packet, for comparing the amplitude of the said pre-trigger level to said amplitude signal and for automatically controlling the amplitude of said pre-trigger level to maintain a working difference therebetween to insure that said analyzer detects said one and only one of said zero level crossings.

2. A zero crossing detector as claimed in claim 1 wherein said control unit is supplied with said amplitude signal being representative of a maximum amplitude of one of said current and said at least one previous input electrical pulse packets.

3. A zero crossing detector as claimed in claim 2 wherein said control unit varies said amplitude of said variable amplitude pre-trigger level to maintain said working difference at a predetermined fraction of said amplitude signal.

4. A zero crossing detector as claimed in claim 1 wherein said pre-trigger unit inhibits supply of said current input pulse packet to said analyzer to inhibit said emission of said trigger signal.

5. An ultrasonic flow meter comprising:

an ultrasound pulse generator which emits an ultrasound pulse;

an ultrasound receiver which receives the ultrasound emitted by said ultrasound pulse generator and which emits an output electrical signal corresponding thereto;

a zero crossing detector comprising an analyzer supplied with a current input electrical pulse packet exhibiting multiple zero level crossings, said analyzer detecting one and only one of said zero level crossings of said current input electrical pulse packet occurring anywhere in said electrical pulse packet and emitting a trigger signal indicative of said occurrence, a pre-trigger unit, also supplied with said current input pulse packet, which monitors variations in an amplitude of said current input pulse packet to detect crossing of a pre-trigger level, having a variable amplitude, by said current input pulse packet, and a control unit, connected to said pre-trigger unit, and supplied with an amplitude signal derived from one of said current input electrical pulse packet and at least one previous input electrical pulse packet, for comparing said pre-trigger level to said amplitude signal and for automatically controlling the amplitude of said pre-trigger level to maintain a working difference therebetween to insure that said analyzer detects said one and only one of said zero level crossings; and an elapsed time indicator connected to said zero crossing detector, which receives said trigger signal from said zero crossing detector and which determines an elapsed time between generation of an ultrasound pulse and emission of said trigger signal.

6. A method for determining a zero crossing point of a current input electrical pulse packet comprising the steps of;

establishing a pre-trigger level;

monitoring variations in an amplitude of said current input electrical pulse packet relative to said pre-trigger level to determine when said amplitude crosses said pre-trigger level;

determining a first occurrence of a zero level, crossing of said, current input electrical pulse packet after said crossing of said pre-trigger level by said current input electrical pulse packet;

monitoring an amplitude signal derived from one of said current input electrical pulse packet and a previous input electrical pulse packet; and adjusting said pre-trigger level dependent on said amplitude signal.

7. A method as claimed in claim 6 comprising deriving said amplitude signal as a maximum amplitude of said one of said current input pulse packet and said previous input electrical pulse packet, and wherein the step of adjusting the pre-trigger level comprises varying said pre-trigger level below said maximum amplitude to maintain said pre-trigger level at a predetermined fraction thereof.

* * * * *